(12) United States Patent
Temchenko et al.

(10) Patent No.: US 7,910,265 B2
(45) Date of Patent: Mar. 22, 2011

(54) RETICLE FOR USE IN A SEMICONDUCTOR LITHOGRAPHIC SYSTEM AND METHOD FOR MODIFYING THE SAME

(75) Inventors: Vlad Temchenko, Dresden (DE); Jens Schneider, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 384 days.

(21) Appl. No.: 12/049,080

(22) Filed: Mar. 14, 2008

(65) Prior Publication Data

US 2009/0233239 A1    Sep. 17, 2009

(51) Int. Cl.
*G03F 1/00* (2006.01)

(52) U.S. Cl. .......................................................... 430/5

(58) Field of Classification Search .............. 430/5, 311, 430/3.94; 355/67
See application file for complete search history.

(56) References Cited

U.S. PATENT DOCUMENTS

| 2001/0002301 | A1* | 5/2001 | Suzuki | 430/5 |
| 2007/0042276 | A1* | 2/2007 | Bae | 430/5 |
| 2007/0258076 | A1* | 11/2007 | Maria Derksen et al. | 355/67 |

* cited by examiner

*Primary Examiner* — Stephen Rosasco
*Assistant Examiner* — Rashid Alam
(74) *Attorney, Agent, or Firm* — Slater & Matsil, L.L.P.

(57) ABSTRACT

A reticle for use in a semiconductor lithographic system includes at least two separated reticle parts. Each part includes a pattern to be transferred lithographically to a substrate. At least one of the two separated reticle parts is independently replaceable.

21 Claims, 2 Drawing Sheets

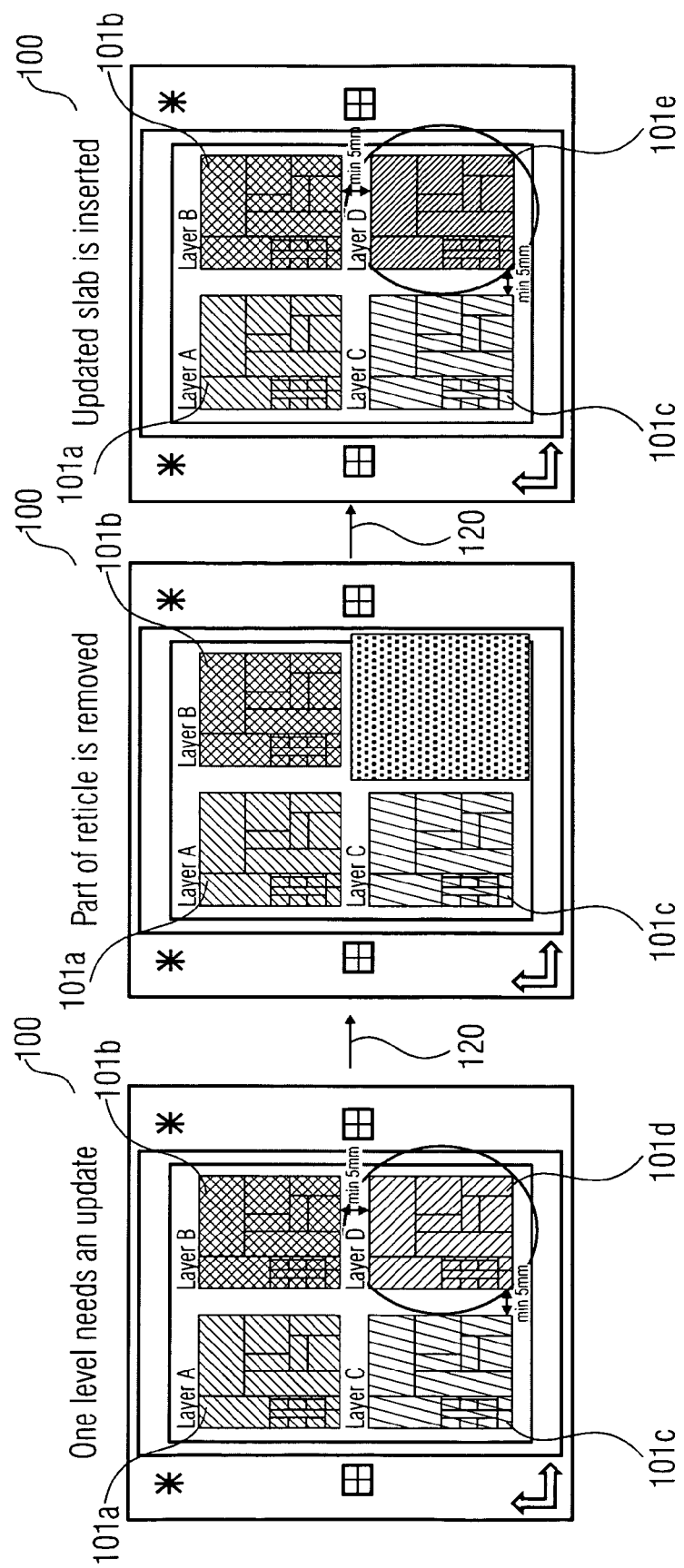

US 7,910,265 B2

RETICLE FOR USE IN A SEMICONDUCTOR LITHOGRAPHIC SYSTEM AND METHOD FOR MODIFYING THE SAME

BACKGROUND

The present invention relates to semiconductor lithography and more particularly to a reticle for use in a semiconductor lithographic system and a method to modify this reticle.

BRIEF DESCRIPTION OF THE DRAWINGS

With reference to the following description of the embodiments of the present invention, it is to be noted that, for simplification reasons, the same reference numerals will be used in the different figures for functionally identical or similarly acting or functionally equal, equivalent elements throughout the description.

FIGS. 3a-c show, according to an embodiment for the method of modifying a reticle used in a semiconductor lithographic system, the replacing of one separated reticle part of the reticle by another separated reticle part;

DETAILED DESCRIPTION OF ILLUSTRATIVE EMBODIMENTS

Embodiments of the invention provide a reticle for use in a semiconductor lithographic system with at least two separated reticle parts, each including a pattern to be transferred lithographically to a substrate. Preferably, at least one of the two reticle parts is independently replaceable. In embodiments of the invention the reticle may include a support, wherein the at least one of the two separated reticle parts is mounted interchangeably. In another embodiment of the invention the reticle may comprise a reticle frame, wherein the at least one of the two separated reticle parts is mounted interchangeably.

With reference to FIGS. 1 to 3c, embodiments relating to a reticle for use in a semiconductor lithographic system and the method of modifying the same will be explained in detail. It is understood that additional embodiments are within the scope of the present invention.

Figure 1:
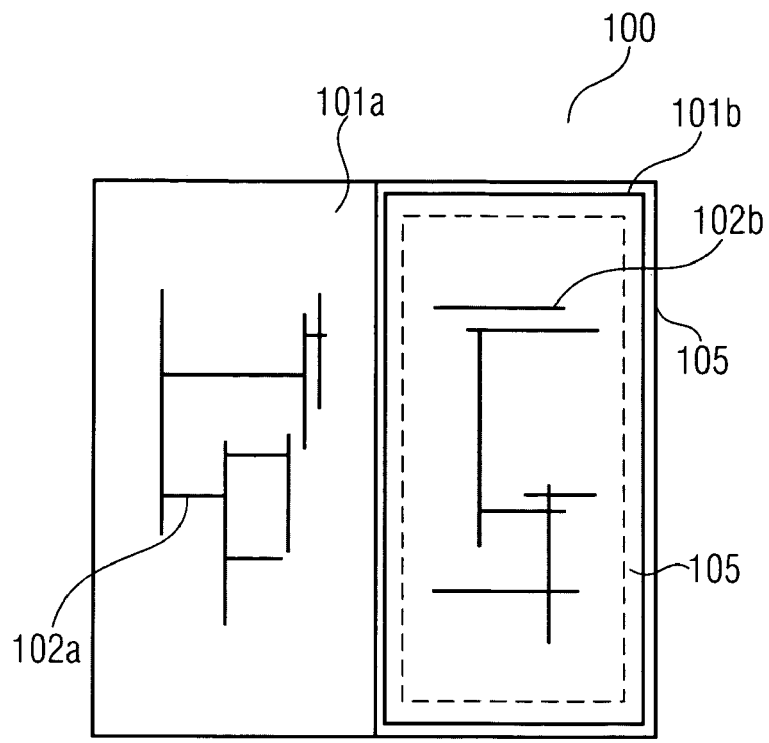
FIG. 1 shows a schematic top view of a reticle for use in a semiconductor lithographic system according to an embodiment of the invention.

FIG. 1 shows a schematic top view of an embodiment of a reticle for use in a semiconductor lithographic system according to an embodiment of the present invention. The reticle 100 includes at least two separated reticle parts 101a, 101b. The reticle parts include pattern 102a (for part 101a) and 102b (for part 101b) that can be transferred lithographically to a substrate. The term separated reticle parts may imply that the separated reticle parts are not physically connected. At least one of the two reticle parts 101a, 101b can be replaced in the reticle.

The reticle 100 can comprise a support, e.g., a reticle frame 105, wherein at least one of the two separated reticle parts 101a, 101b is mounted interchangeably. This means that at least one of the two separated reticle parts is independently replaceable from a remaining reticle part. In other words it can be removed without the need to remove a remaining reticle part as well. The reticle part that is not replaced may be good for a further usage and the reticle part that is replaced may be substituted by a "good" or new one.

The use of advanced reticle enhancement technologies demanded by very large-scale integrated semiconductor technologies (VLSI) leads to a dramatic increase in mask production costs. The reticle 100 could be a so-called multi-level reticle whose usage is expected to increase due to substantial cost savings over a single-level approach. The separated reticle parts 101a, 101b in such a multi-level reticle could comprise the pattern for different mask levels of a certain integrated circuit or micro-chip. That means, for example, that the pattern of an active area (RX) level, the poly-conducting (PC) level, the metal layer 1 (M1) and the metal layer 2 (M2) can be combined together in one reticle in such a way that the separated reticle parts forming the reticle comprise the corresponding mask levels for a certain process technology. The process technology employing the multi-level reticle 100 as described above could be, for example, a conventional logic process technology.

Figure 2:
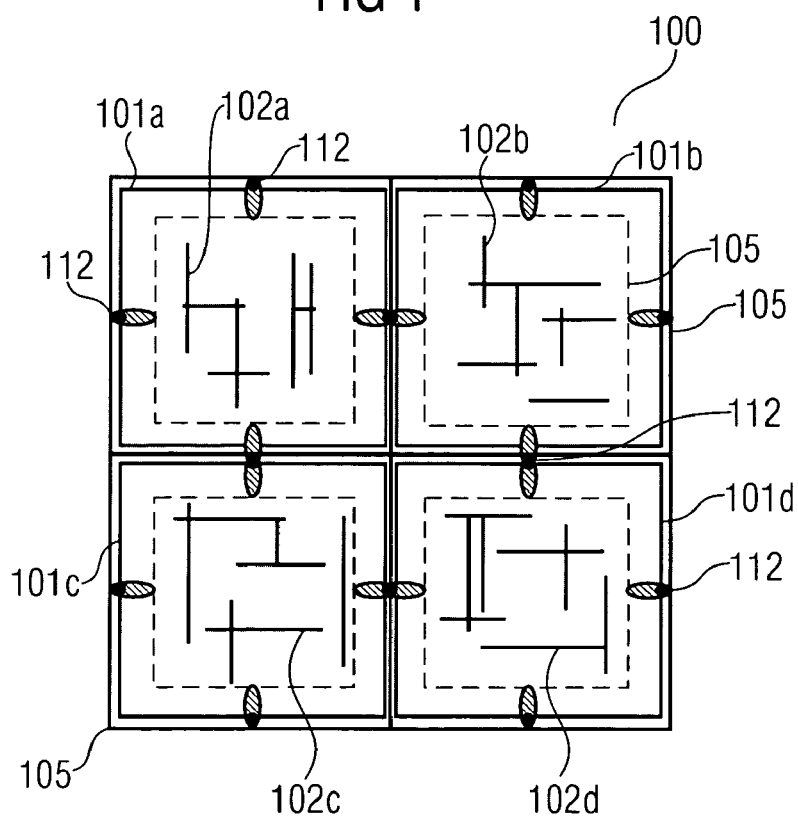
FIG. 2 shows another schematic top view of a reticle for use in a semiconductor lithographic system according to an alternative embodiment of the invention.

This is exemplarily shown in FIG. 2, where the reticle 100 comprises four separated reticle parts 101a to 101d, wherein each of the reticle parts can comprise different pattern for a different mask level for an integrated circuit or in general for any semiconductor element. That is to say exemplarily the separated reticle part 101a could comprise the pattern 102a for the RX mask level for a semiconductor device fabricated in a conventional logic technology, the pattern 102b could comprise the mask level for the poly-conducting (PC) level and the patterns 102c and 102d of the separated reticle parts 101c and 101d could comprise the metal 1 and metal 2 mask levels.

According to another embodiment one reticle part can also comprise a plurality of identical or different pattern for diverse mask levels of an integrated circuit or in general for any semiconductor element.

In the alternative embodiment shown in FIG. 2, the support, e.g., the reticle frame 105 can comprise exemplarily four separated reticle parts (101a to 101d), which can be fixed, for example, by a mechanical mechanism 112 formed to mount the separated reticle parts interchangeably in the reticle frame. The depicted mechanical setup 112 is more illustrative than real. That means there can be more advanced mechanism for fixing interchangeably the single separated reticle parts in the reticle frame, so that a structure or pattern of a separated reticle part can be transferred lithographically to a substrate in a semiconductor lithographic system. Such an advanced fixing mechanism could, for example, rely on mechanic, electric, magnetic or electromagnetic forces in order to fix interchangeably the separated reticle parts in the reticle frame. But it is also possible to fix the separated reticle parts by other means and forces.

In an alternative embodiment, the pattern of the different separated reticle parts mounted interchangeably in the reticle frame can comprise the same pattern. It is also possible that a reticle comprises separated reticle parts with the same pattern.

During the development of an integrated circuit, microchip respectively, it may be necessary to update or change one of the patterns due to a design change. In case of using a reticle 100 with separated reticle parts that are mounted interchangeably as described in connection with FIGS. 1 and 2, a respective separated reticle part can be replaced easily by an updated or optimized reticle part, without the need of fabricating a complete new and expensive reticle 100. In fact, the other pattern of the separated reticle parts, which do not have to be changed can be used further on.

If, for example, in FIG. 2 one of the four patterns 102a to 102d in the respective separated reticle parts 101a to 101d needs an update, for example, because of a design update, a kerf or scribe line update, an optical proximity correction (OPC) update and many other reasons, no complete new reticle 100 needs to be ordered, but only the respective reticle part. That means that the reticle 100, described so far, can contribute to a substantial mask fabrication cost saving for semiconductor manufacturing.

Mask error correction methods are known. However, the reticle described in context with the embodiments of FIGS. 1 and 2 provide a further possibility for an easy full-level repair on, for example, ½, ¼, or ⅙ of such a reticle. That means that updating a mask level, a level in a multi-level reticle respectively, will require reworking only the area of corresponding image on an assembled mask. The reticle described above can be regarded as an assembled mask. By assembling a multi-level reticle 100, from for example 2, 4, 6 parts, it is possible to pull a reticle part of the multi-level reticle 100 out and replace it with a new, updated or changed reticle part.

Alignment and leveling of the different separated reticle parts of the reticle 100 may not pose a problem, because each reticle part that may represent a lithographical level can be aligned separately with its own dose, focus, tilt offsets and overlay corrections in a photolithographic system. The assembled multi-level reticle 100 may allow replacing a reticle part, which includes a wrong pattern for a mask, in order to modify a level in a semiconductor process technology, with an updated one without the need to replace the other correct levels of the (multi-level) reticle.

The separated reticle parts may comprise conventional materials for forming a mask for a semiconductor lithographic system. For example, the separated reticle parts may comprise a glass substrate and a layer of at least one of the chromium (Cr), chromium oxide (CrO), iron oxide (FeO) or molybdenum silicide ($MoSi_2$) on the glass substrate therein the pattern to be transferred to the substrate is formed. As an alternative the pattern of the separated reticle parts to be transferred to a substrate may be exemplarily formed by etched trenches in a glass substrate representing the reticle. That means the reticle may be formed as a phase mask.

The separated reticle parts are formed to transfer the pattern to the substrate by transmitting a beam from the lithographic system, so that the patterns are transferred to the substrate by the transmitted beam. The beam from the lithographic system can comprise radiation from the electromagnetic spectrum or particles.

In embodiments of the invention, the reticle and the at least two separated reticle parts are formed such that they can be aligned in a semiconductor lithographic system, so that the pattern or structure on the separated reticle parts can be transferred lithographically to a substrate.

In general, the substrate may be, for example, a semiconductor layer, a wafer covered with a photoresist or it may be a mask, which is used afterwards to transfer the structure of the pattern of the separated reticle parts to a substrate. Aspects of the invention, however, can also be applied to non-semiconductor lithographic embodiments.

The separated reticle parts, which are described in connection with FIGS. 1 and 2, may, in one embodiment, be formed to transfer the pattern to the substrate by transmitting a beam from the lithographic system, so that the pattern is copied on the substrate by the transmitted beam. That means that the separated reticle parts of the reticle may transmit at certain parts an electromagnetic radiation in the visible, ultraviolet (UV) or X-ray spectrum.

The photolithographic system and the reticle may be formed such that the pattern on the separated reticle parts are transferred to the substrate in a certain scale, for example in a ratio 4:1 or 5:1. That means the reticle image may be either transferred 1:1 in size or reduced, for example, by 4:1 or 5:1.

In another embodiment, the separated reticle parts of the reticle may be formed as shadow masks, with respective openings forming the pattern, able to transmit a particle beam, for example an electron beam.

In another embodiment, the separated reticle parts of the reticle are formed to transfer the pattern to the substrate by reflecting a beam from the lithographic system, so that the pattern is depicted on the substrate by the reflected beam. For example, in contrast to the foregoing embodiment, the separated reticle parts are able to reflect, for example, an electromagnetic radiation or a particle beam in such a way that the pattern depicted on the reticle part is transferred to a substrate or exemplarily to a photoresist on a substrate.

In an alternative embodiment, the pattern of the separated reticle parts of the reticle comprise at least a distance of approximately 5 mm to each other. That is the separated reticle parts may comprise an edge region, without a pattern. In this embodiment, the minimum distance between the patterns of neighboring reticle parts may be about 5 mm.

An apparatus for use in a semiconductor lithographic system may comprise first means for defining a pattern which shall be transferred lithographically to a substrate, second means for defining a pattern, which shall be transferred lithographically, as well, to a substrate. The first and the second means can be, for example, the above-described separated reticle parts and accordingly the apparatus the reticle. That is to say at least one of the first or second means is replaceable. The apparatus comprises third means in order to fix interchangeably the first and the second means in the apparatus. This might be, for example, a mechanical mechanism to fix interchangeably at least one of the first or second means in the apparatus.

A further embodiment of the present invention describes a method of modifying a reticle 100, used in a semiconductor lithographic system, comprising at least two separated reticle parts 101a, 101b, each comprising pattern 102a, 102b to be transferred lithographically to a substrate, and a reticle frame 105, in which the at least two separated reticle parts 101a, 101b are mounted interchangeably, wherein the method comprises replacing 120 at least one of the two reticle parts 101a, 101b with a modified reticle part.

In FIGS. 3a-c, an embodiment for the method of modifying a reticle, used in a semiconductor lithographic system, according to the present invention is depicted.

As it is shown schematically in FIG. 3a, one 101d, out of exemplarily four separated reticle parts 101a to 101d may be identified as a reticle, which shall be modified. After identifying a reticle which should be replaced, the method can furthermore comprise an opening of a fixing for the separate reticle part to be modified. The opening of a fixing could be for example an opening of a mechanical mechanism on the reticle frame. Moreover, the method can comprise, as it is depicted in FIG. 3b, removing of the d reticle part to be modified 101d, whereas the left separated reticle parts 101a to 101c are not changed. That means that the separated reticle part 101d can be replaced by a modified, updated or changed reticle part 101e (see FIG. 3c). The exchanged reticle part 101e may be mounted or fixed interchangeably again in the reticle frame. With the above-described method, it has been shown that exemplarily one level of an assembled fourfold multi-level reticle can be easily replaced. If one level needs an update, the respective part of the reticle is just removed and the updated slab may be inserted.

Embodiments of the present invention may comprise, among others, a number of benefits for the use of a reticle as described in embodiments of this invention and by performing the method of modifying a reticle as described above. For example, embodiments show that using the reticle as described above can reveal a cost saving in mask production. This can be achieved by only fixing "bad" reticle parts or levels of a multi-level reticle without ordering a complete new reticle. Because of the interchangeable separated reticle parts, it is also possible to achieve a faster reticle turnout time, in that way that certain mask levels of an integrated circuit can be already processed by a separated reticle part at a time point, where other photolithographic levels for an certain integrated circuit may not be yet defined finally. That is to say a wafer for a respective integrated circuit can be already fabricated up to a certain mask level, when just rough estimates of future costs and demands are available. At the beginning of the fabrication of an integrated circuit on a wafer not all mask levels, the separated reticle parts respectively may be available. Nevertheless, the manufacturing can be already started and missing mask levels with the respective reticle parts can be inserted at a later time point to the reticle. This may be advantageous in order to fulfill the demanding "time to market" requirements for semiconductor products.

Embodiments of the present invention may furthermore offer the possibility to reduce or eliminate process variations for the fabrication of an integrated circuit by using only "good" levels or reticle parts for manufacturing. Furthermore, a reticle part which shall be modified does not interrupt the production since the modified reticle part may be mounted on the production side.

What is claimed is:

1. A reticle for use in a semiconductor lithographic system, the reticle comprising:
    at least two separated reticle parts laterally spaced from each other, each reticle part comprising a pattern to be transferred lithographically to a substrate, wherein at least one of the two separated reticle parts is independently replaceable relative to the other of the two separated reticle parts; and
    a support, wherein the at least one of the two separated reticle parts is mounted interchangeably at the support.

2. The reticle according to claim 1, wherein the support comprises a reticle frame.

3. The reticle according to claim 1, wherein the support further comprises means to fix interchangeably the at least one of the two separated reticle parts.

4. The reticle according to claim 1, wherein the at least two separated reticle parts comprise patterns of different lithographical levels of a semiconductor element.

5. The reticle according to claim 1, wherein the at least two separated reticle parts comprise chromium, chromium oxide, iron oxide or molybdenum silicide.

6. The reticle according to claim 1, wherein each of the at least two separated reticle parts is formed to be alignable separately in the semiconductor lithographic system.

7. The reticle according to claim 1, wherein the at least two separated reticle parts are formed to transfer the pattern to the substrate by transmitting a beam from the lithographic system, so that the patterns are transferred to the substrate by the transmitted beam.

8. The reticle according to claim 7, wherein the beam from the lithographic system comprises radiation from the electromagnetic spectrum.

9. The reticle according to claim 1, wherein the at least two separated reticle parts are formed to transfer the pattern to the substrate by reflecting a beam from the lithographic system, so that the pattern are transferred to the substrate by the reflected beam.

10. The reticle according to claim 1, wherein the patterns of the at least two separated reticle parts comprise a distance of at least about 5 mm to each other.

11. A method of semiconductor processing, the method comprising:
    providing a semiconductor lithographic system that comprises at least two separated reticle parts laterally spaced from each other and a reticle frame, wherein at least one of the two separated reticle parts is mounted interchangeably on the reticle frame, each reticle part comprising a pattern to be transferred lithographically to a substrate; and
    replacing at least one of the two separated reticle parts with a replacement reticle part.

12. The method according to claim 11, further comprising:
    identifying at least one of separated reticle parts to be replaced;
    opening a fixing of the separated reticle part to be replaced on the reticle; and
    mounting the replacement reticle part on the reticle frame to replace at least one of the two reticle parts with the replacement reticle part.

13. The method according to claim 11, wherein the replacement reticle part comprises a modified reticle part that is different has a pattern that is different that the pattern of either of the two separated reticle parts.

14. An apparatus for use in a semiconductor lithographic system, the apparatus comprising:
    first reticle for defining a first pattern to be transferred lithographically to a substrate;
    second reticle for defining a second pattern to be transferred lithographically to a substrate, wherein the first reticle and the second reticle are laterally arranged relative to each other; and wherein at least one of the first and the second reticle is replaceable; and
    third reticle for interchangeably fixing the first reticle and the second reticle in the apparatus;
    wherein at least one of the first reticle and the second reticle are mounted interchangeably on the third reticle.

15. A reticle for use in a semiconductor lithographic system, reticle comprising:
    at least a first reticle part having a first pattern to be transferred lithographically;
    a second reticle part having a second pattern to be transferred lithographically, wherein the second reticle part is replaceable without the need to replace the first reticle part and wherein the first reticle part and the second reticle part are laterally spaced from each other; and
    a support, wherein the first reticle part is removably attached to the support.

16. The reticle according to claim 15, wherein the support comprises a reticle frame.

17. A reticle for use in a semiconductor lithographic system, the reticle comprising:
    a support;
    a first reticle part having a pattern to be transferred lithographically, the first reticle part being attached to the support; and
    a second reticle part having a pattern to be transferred lithographically, wherein the second reticle part is laterally spaced from the first reticle part and wherein the second reticle part is removably attached to the support such that the second reticle part can be removed from the support and replaced without the need to remove the first reticle part.

18. The reticle according to claim 17, wherein the first reticle part is removably attached to the support such that the first reticle part can be replaced without the need to remove the second reticle part.

19. The reticle according to claim 17, wherein the support comprises a reticle frame.

20. The method according to claim 11, further comprising lithographically transferring the pattern to the substrate.

21. The method according to claim 20, wherein lithographically transferring comprises transmitting a beam through the replacement reticle.

* * * * *